(12) United States Patent
Sancheti et al.

(10) Patent No.: US 7,135,899 B1
(45) Date of Patent: Nov. 14, 2006

(54) SYSTEM AND METHOD FOR REDUCING SKEW IN COMPLEMENTARY SIGNALS THAT CAN BE USED TO SYNCHRONOUSLY CLOCK A DOUBLE DATA RATE OUTPUT

(75) Inventors: Sanjay Sancheti, Starkville, MS (US); Suwei Chen, Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 38 days.

(21) Appl. No.: 10/844,719

(22) Filed: May 13, 2004

Related U.S. Application Data (60) Provisional application No. 60/483,484, filed on Jun. 27, 2003.

(51) Int. Cl.
*H03L 7/00* (2006.01)

(52) U.S. Cl. .................... 327/144; 341/101
(58) Field of Classification Search ................ None
See application file for complete search history.

(56) References Cited

U.S. PATENT DOCUMENTS

| | | | | |
|---|---|---|---|---|
| 5,726,990 | A * | 3/1998 | Shimada et al. | 370/536 |
| 5,970,070 | A * | 10/1999 | Ho et al. | 370/462 |
| 6,426,662 | B1 * | 7/2002 | Arcus | 327/295 |
| 6,606,360 | B1 * | 8/2003 | Dunning et al. | 375/354 |
| 6,614,371 | B1 * | 9/2003 | Zhang | 341/101 |
| 6,700,429 | B1 * | 3/2004 | Kanno et al. | 327/333 |
| 2003/0141908 | A1 * | 7/2003 | Stong | 327/141 |
| 2005/0089126 | A1 * | 4/2005 | Zerbe et al. | 375/353 |
| 2005/0108600 | A1 * | 5/2005 | Arguelles | 714/701 |

\* cited by examiner

*Primary Examiner*—Timothy P. Callahan
*Assistant Examiner*—Cassandra Cox
(74) *Attorney, Agent, or Firm*—Kevin L. Daffer; Daffer McDaniel, LLP (57) ABSTRACT

A circuit, system, and method are provided for generating edge-aligned, complementary output signals from complementary input signals. The output and input signals can, according to one example, be clock signals. The circuit, system, and method can use the rising edges of the complementary pair of input signals to trigger transitions on the complementary pair of output signals. More specifically, the rising edge of a true input clock signal will trigger the rising edge of the true output clock signal and the falling edge of the inverted output clock signal. A rising edge of the inverted input clock signal will trigger the falling edge of the true output clock signal, and the rising edge of the inverted output clock signal. Moreover, the circuit, system, and method ensures that at any time only one transition occurs on the active inputs of a final logic stage of the clock generation circuit. Also, the circuit, system, and method support double data rate (DDR) data and echo clock generation, where the echo clock transitions in sync with the DDR output.

13 Claims, 9 Drawing Sheets

| CLK | CLKB | Q0(n+1) | Q1(n+1) | Q2(n+1) | CLK=Q0(n+1) Q1(n+1)+ Q0B(n+1)Q2(n+1) | CLKOB=Q0B(n+1) Q1(n+1)+ Q0B(n+1)Q2(n+1) |
|---|---|---|---|---|---|---|
| 0→1 | X | Q0(n) | Q0(n) | Q0b(n) | Q0(n)Q0(n)+Q0b(n)Q0b(n)=1 | Q0b(n)Q0(n)+Q0(n)Q0b(n)=0 |
| X | 0→1 | Q0b(n) | Q0(n) | Q0b(n) | Q0b(n)Q0(n)+Q0(n)Q0b(n)=0 | Q0(n)Q0(n)+Q0b(n)Q0b(n)=1 |

SYSTEM AND METHOD FOR REDUCING SKEW IN COMPLEMENTARY SIGNALS THAT CAN BE USED TO SYNCHRONOUSLY CLOCK A DOUBLE DATA RATE OUTPUT

PRIORITY APPLICATION

This application claims priority to provisional application No. 60/483,484 entitled "Sense Amplifier with Dual Cascode Transistors and Method of Using the Same," filed Jun. 27, 2003.

BACKGROUND OF THE INVENTION

1. Field of the Invention

This invention relates to electronic circuitry and, more particularly, to circuitry used within a system that can essentially eliminate skew in complementary signals, such as clock signals used to synchronize double data rate data output for source synchronous systems.

2. Description of the Related Art

The following descriptions and examples are not admitted to be prior art or conventional by virtue of their inclusion within this section.

Electronic subsystems typically operate as synchronous systems. A synchronous system is often thought of as a system that enters one state after departing a preceding state. The impetus for transitioning between states might be, for example, a regular and periodic signal that triggers the transition. Most such signals are referred to as clocking signals. Thus, synchronous electronic systems rely upon a reliably periodic stream of clocking cycles.

Unfortunately, not all clocking signals maintain their regular and periodic cycles due, in part, to jitter and noise placed on those signals. Not only might the transitional edges of the clock signal periodically vary due to jitter and skewing effects, but when electronic subsystems rely on complementary clock signals, then any jitter on one of the complementary pair will delay one clock relative to the other. As used herein, the term "skew" refers to essentially the time difference between signals due to jitter, noise, or timing differences for logic that produce those signals.

When applied to clock signals, any clocking signal skew will change the transition point between cycles on an irregular or inconsistent basis or, possibly, on a cumulative basis. Complementary signals or complementary clock signals utilize what is known as a true signal and an inverted signal. If there is any clock skew between the true and inverted signals, then transitions on the inverted signal will occur in advance of, or be delayed relative to, the true signal.

In electronic subsystems that rely upon complementary signals in general or complementary clock signals specifically, it is desirable for the complementary clock signals to transition at the same time. If not, then transitions in the state sequence affected by the true clock signal will be skewed from transitions in the sequence affected by the inverted clock signal. Most digital sequential systems rely upon complementary clock signals and, more specifically, complementary clock signals that do not have substantial skew or delay between transitions of the true and inverted signals. It is, therefore, desirable to reduce clock skew and jitter in complementary signals used to sequentially operate electronic subsystems.

SUMMARY OF THE INVENTION

The problems of clock skew, jitter, and noise placed on complementary signals can be minimized if transitions of the complementary signals are readjusted either once or periodically as those signals are placed into corresponding electronic subsystems. According to one embodiment, the complementary signals can be complementary clock signals used to effectuate state transitions in a sequential electronic subsystem. An improved circuit is thereby utilized to generate complementary output signals that essentially have little, if any, skew. That is, the complementary output signals can be clock signals that have no time delay between transitions on the true output clock signal and the inverted output clock signal, even though the complementary input clock signal is time-skewed.

According to one embodiment, the circuit can include a set of flip-flop circuits coupled to receive the complementary pair of input signals that are time-skewed. The circuit can also include a set of multiplexer circuits coupled to the set of flip-flop circuits for producing a complementary pair of output signals that are substantially absent of any time-skew. The output signals purposely transition on only the rising edges of the complementary pair of input signals, and not on any falling edges of the complementary pair of input signals. By transitioning on only the rising edges, the complementary output signals are assured not only to transition at the same time, but also to transition when there is sufficient setup time interval of the data input to the flip-flop circuits preceding transitions of the input signals. Thus, the circuit is self-regulated in that, by design, the flip-flop circuitry is assured not to enter any meta-stable states. In addition, the circuit does not require any reset of the output signals prior to the flip-flop circuits receiving the complementary input signals. Prior to any input signals upon the circuit, the complementary output signals will be forced into dissimilar logic values.

According to yet another embodiment, a system is provided for synchronizing the transfer of data. The system is based on the premise that the complementary pair of input signals and the complementary pair of output signals transition at the same rate, wherein the input and output signals can be clock signals. Thus, the system includes a clock generating circuit that produces the complementary pair of output clock signals that are substantially absent of any time-skew therebetween. The system can also include a multiplexing circuit that interleaves in time at least two serial bitstreams of data. An output circuit can then transfer one bit of the interleaved serial bitstreams as a single serial bitstream during each transition of the complementary pair of input clocks signals. The serial bitstream is synchronized to the complementary pair of output input clock signals, but synchronized at twice the data transfer rate. The output circuit can thereby include a pair of D-type flip-flops with a corresponding pair of data outputs coupled to an input of a multiplexer. The multiplexer can select a pair of successive bits to be placed on the single, serial bitstream during each cycle of the complementary pair of input clock signals. The single serial bitstream transfers data at twice the rate as the complementary pair of input and output clock signals.

The system for synchronizing the transfer of data can be used, if desired, in any electronic system that relies upon a source of synchronous data and clock signals. The system thereby is advantageously used to synchronize data transfer with the complementary output clock signals, but also to transfer the data at twice the cycle rate as the output clock signals. In many electronic subsystems such as, for example, double data rate (DDR) source-synchronous DRAM, sometimes referred to as DDR SDRAM, it is necessary to generate data transfer at twice the clock rate, yet synchronous with the clock edges. Although DDR SDRAM is one example of a DDR source-synchronous system, there are many others that would enjoy the benefits of a skewless complementary pair of output signals that can be used to synchronize data transfer at twice the rate as the complementary signals.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Figure 1:
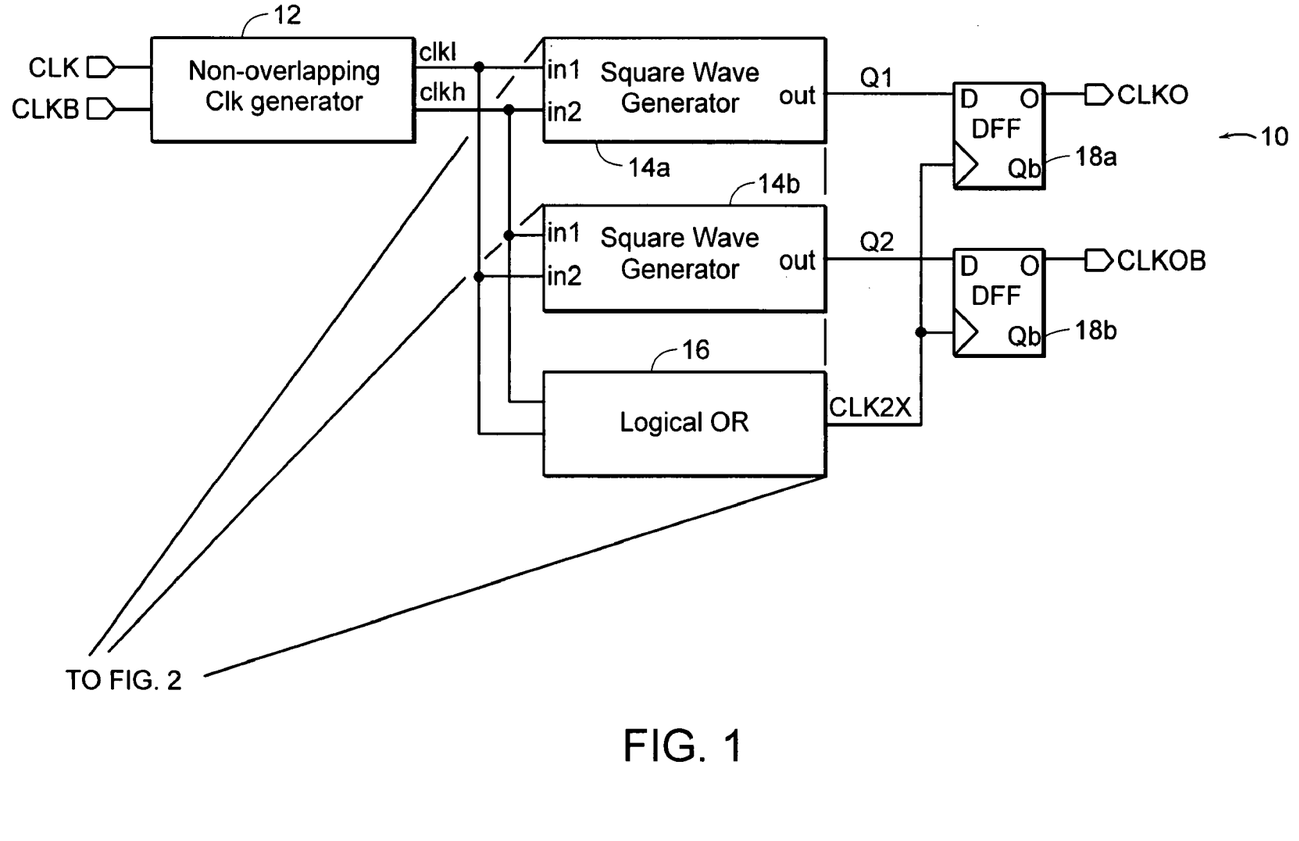
FIG. 1 is a block diagram of a system for removing skew from complementary clock signals.

Turning now to the drawings, FIG. 1 is a block diagram of a circuit 10 used for generating complementary output signals that have little if any skew. Circuit 10 includes a clock generator 12 that generally operates as a mono-stable multi-vibrator, oftentimes referred to as a "one-shot." One-shot 12 has only one stable state and a quasi-stable state. During operation, the one-shot remains in its stable state until a triggering signal is received, such as a rising edge on the true input clock signal (CLK) or the rising edge of the inverted input clock signal (CLKB). Upon receipt of the rising edges, the one-shot changes to the quasi-stable state for a fixed period of time. That time value is predetermined based on the cycle length of the true and inverted complementary pair of input signals. It is generally desired that the fixed period of time be somewhere less than ¼ cycle of the complementary pair of input signals, both of which transition at the same rate.

Figure 2:
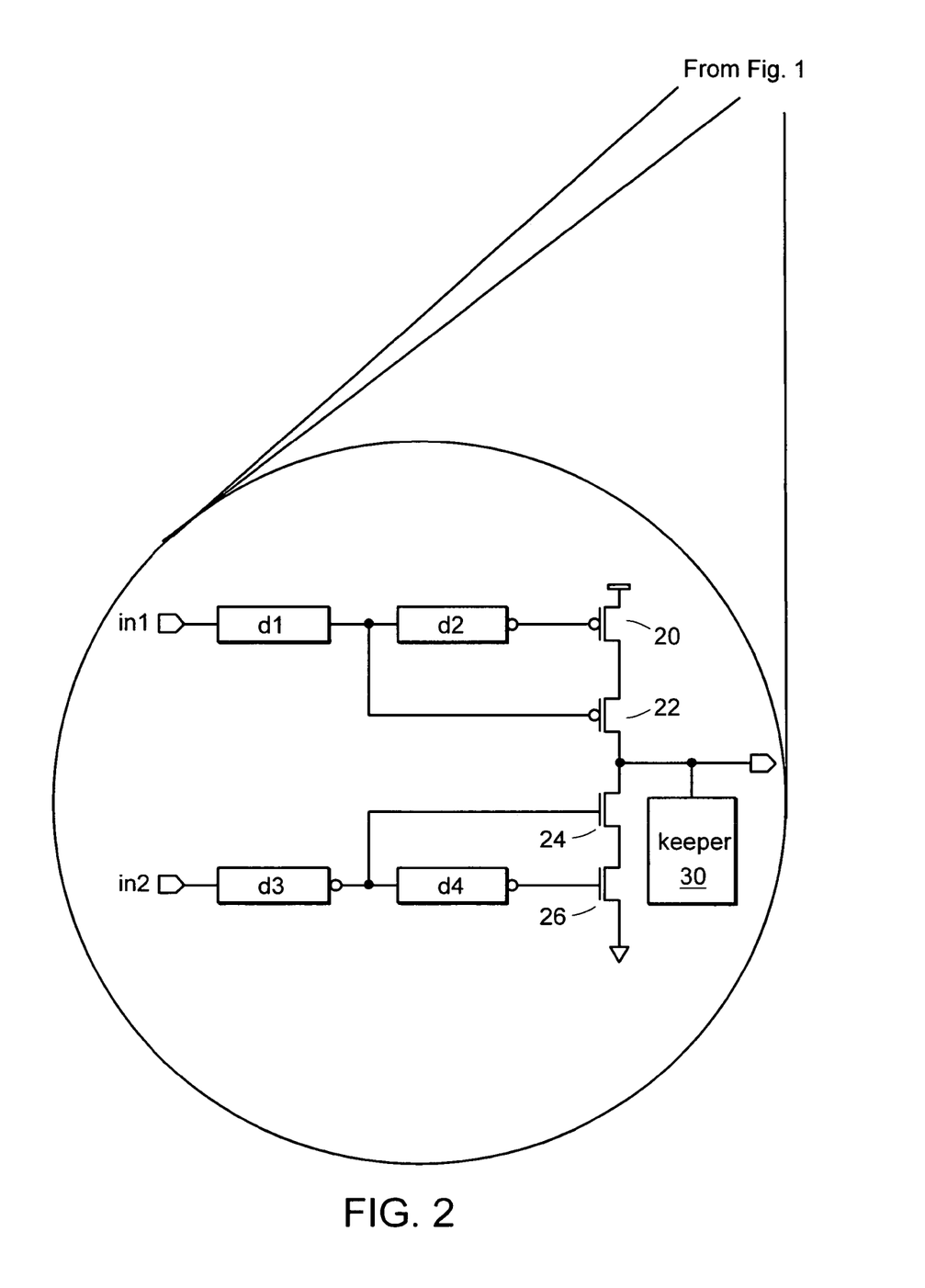
FIG. 2 is a detailed block diagram of the square wave generator circuits of FIG. 1.
Figure 3:
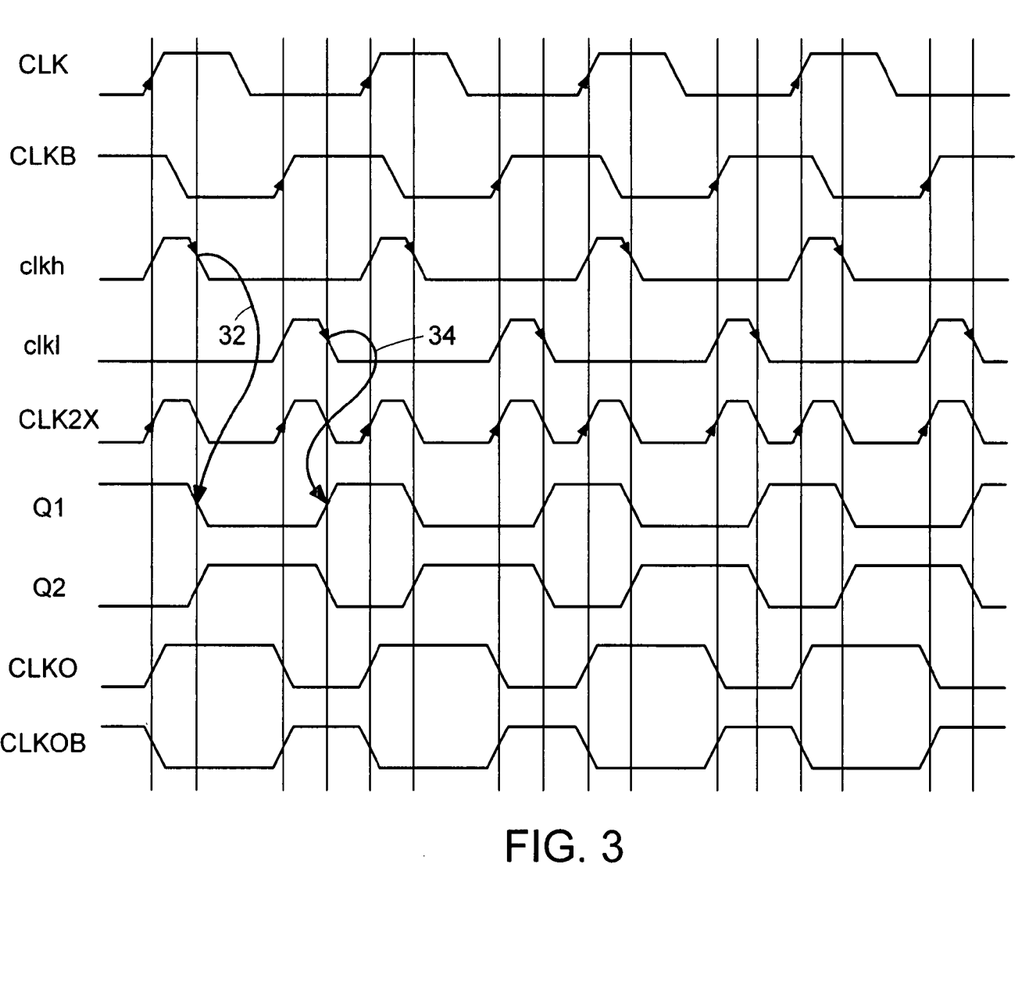
FIG. 3 is a timing diagram of signals input to and produced from various components illustrated in FIG. 1.

Circuit 10 also includes a pair of square wave generators 14a and 14b. The inputs to generators 14a and 14b are inverted as shown. The outputs from generators 14a and 14b transition at the same time, and will be more thoroughly described in reference to FIGS. 2 and 3. In addition to generators 12 and 14, circuit 10 also includes a logical OR gate 16. OR gate 16 combines the outputs from clock generator 12 to produce a clock (CLK2×) that transitions at twice the rate as the complementary pair of input signals. The 2× clock is then used to latch in the outputs from generators 14a and 14b onto flip-flops 18a and 18b. The waveforms associates with circuit 10 and the details of generators 14a and 14b are shown in FIGS. 2 and 3.

Referring to FIG. 1, inputs Q1 and Q2 of flip-flops 18a and 18b are preset to a correct level by the two falling edge-triggered square wave generators 14a and 14b, driven by the first and second clock inputs. A falling edge of clkl in the square wave generator 14a will set the output Q1 to a logic high voltage value, and a falling edge of clkh will set output Q1 to a logic low voltage value. The square wave generators 14a and 14b take as inputs two non-overlapping signals, where both inputs cannot be at a logic high voltage value simultaneously.

Referring again to FIGS. 2 and 3, if both clkh and clkl are at a logic low voltage value, then the inverting and non-inverting delay elements d1–d4 will produce dissimilar logic values on the gate terminals of transistors 20–26. However, if clkl remains at a logic low voltage value and clkh transitions from a logic high voltage value to a logic low voltage value, then delay element d3 will invert momentarily the logic low voltage value to a logic high voltage value, which will cause transistor 24 turn on, but delay element d4 will not yet place a logic high voltage value onto the gate of transistor 26. Instead, transistor 26 will remain in an on condition until delay element d4 transitions it to an off condition. During that interim, however, transistors 24 and 26 will turn on, forcing the "keeper" circuit 30 to discharge the output node to ground. Thus, Q1 will transition to a logic low voltage value; this transition is shown as reference numeral 32 in FIG. 3.

The keeper circuit is essentially any circuit that will keep the output node from floating between rails. According to one example, the keeper circuit can be a back-to-back inverter pair that holds the output node. Provided transistors 24 and 26 enter a saturation mode sufficient to discharge the capacitive loading on the output node, keeper 30 voltage value can be reduced momentarily, and thereafter maintained at a logic low voltage value even after transistors 20–26 no longer pull the output nodes to one rail or the other. If, for example, clkl transitions from a logic high voltage value to a logic low voltage value, while clkh remains in a logic low voltage value, then the transition to a logic low voltage value will cause delay element d1 to turn transistor 22 on, but delay element d2 has not yet caused transistor 20 to turn off (i.e., transition to a logic low voltage value has not yet propagated through delay element d2). This will cause transistors 20 and 22 to momentarily be on and will thereby force keeper 30 to charge to a power supply voltage at the output node Q1, as shown by reference numeral 34 of FIG. 3.

Since square wave generator 14b is simply the inverse of square wave generator 14a, output Q2 has transitions that occur at the same time as output Q1, but in inverse. As shown in FIG. 3, Q1 and Q2 arrive in their steady state voltage value for a setup time sufficiently preceding the CLK and CLKB transitions to prevent any meta-stable states within the flip-flop circuits 18a and 18b (FIG. 1). Thus, the complementary pair of output signals (CLKO and CLKOB) occur at the rising edges of the complementary pair of input signals.

Although circuit 10 of FIG. 1 is well-suited to some applications, there are some limitations that would preclude the generation of a double-rate clock (CLK2×). The double-rate clock oftentimes involves complicated circuitry and longer clock-to-propagation delay. Moreover, generating and maintaining the double-rate clock may cause signal integrity concerns more easily when the complementary pair of input signals are running at a fairly high frequency. According to one example, if the complementary pair of input signals run at 200 MHz, then the double-rate clock signal (CLK2×) must run at 400 MHz. This will leave a clock pulse for the double-rate clock of approximately 1.25 ns, assuming a 50% duty cycle. If a 50% duty cycle is not maintained, then the pulse width is even smaller and, due to process skews of the integrated circuit, it is difficult to reliably maintain these rather small pulse widths.

In addition, although the square wave generators 14a and 14b generally do not need reset circuitry, a reset is nonetheless required if the complementary pair of input signals have not yet transitioned to opposing rails and the complementary pair of output signals might then take on forbidden, non-complementary states. Thus, during startup it is desired to force the outputs to non-forbidden states. Also, due to some transistor-level intricacies (e.g., the propagation delay of delay elements d2 and d4 may be mismatched), it is desirable to do some simulation verification of each implementation of the square wave generator output to ensure internal mismatches do not produce a skew on outputs Q1 and Q2 or cause any timing violations in the flip-flop circuits 18a and 18b (FIG. 1).

Figure 9:
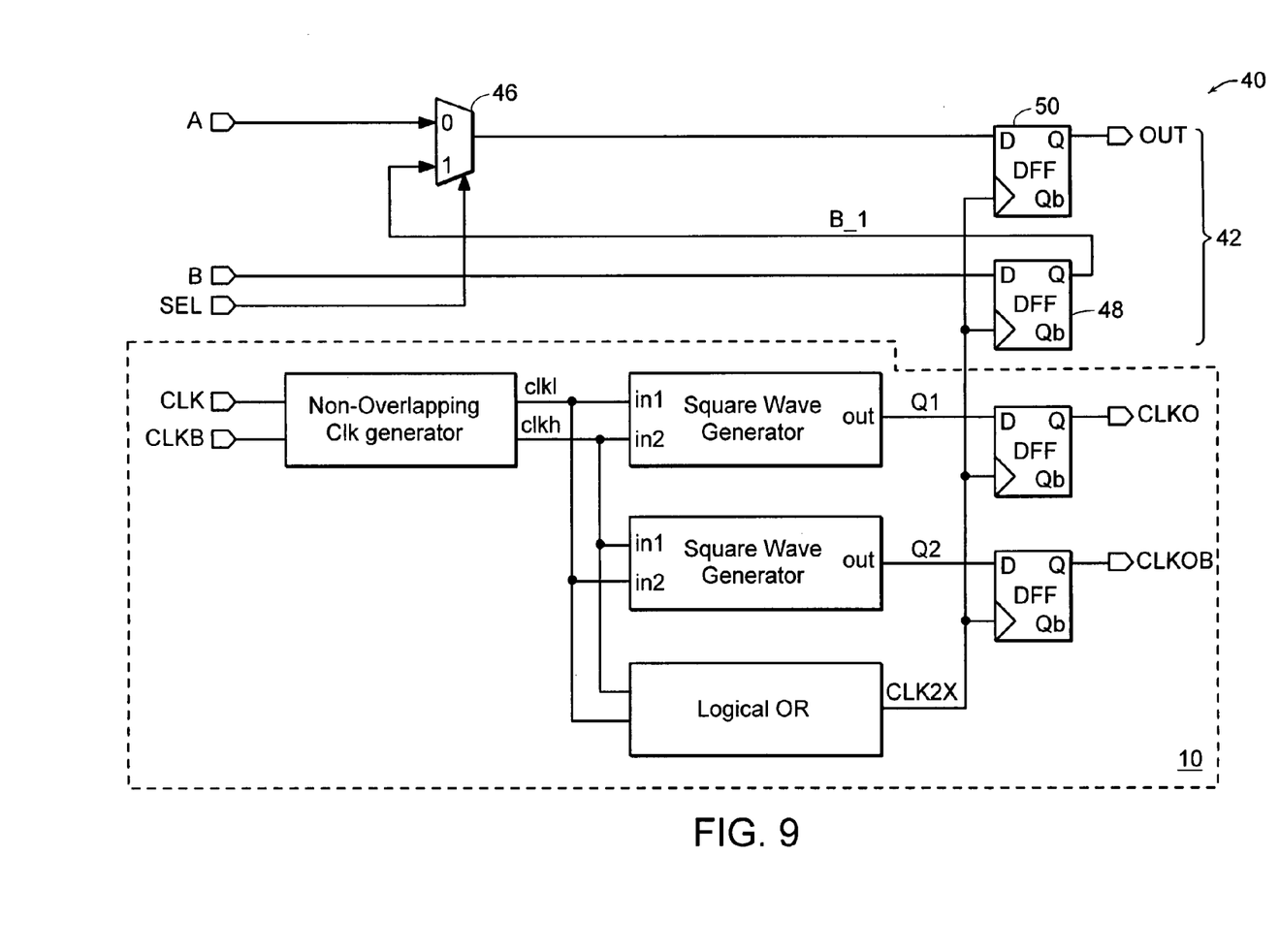
FIG. 9 is a block diagram of a DDR output synchronized with a double rate slew-less clock signal according to one embodiment.

Another limitation associated with the clock generation circuit 10 is indigenous to the double-rate clock when applied to double data rate (DDR) interfaces. FIG. 9 illustrates circuit 10 employed as a complementary edge-aligned echo clock generator for DDR interfaces. Specifically, circuit 10 is shown within a system 40 for synchronizing the transfer of data. As shown, circuit 10 receives the complementary pair of input clock signals CLK and CLKB, and passes them through non-overlapping clock generators and into the logical OR gate to produce the double clock rate signal CLK2×. The double clock rate signal then drives the flip-flops not only of the clock generator, but also in the DDR data output path 42.

Data output path 42 includes two serial bitstreams A and B. In addition, a select signal can occur at the same frequency as the data bitstreams to select, in time-division multiplex, a first bit within stream A, followed by a first bit in stream B, followed by a second bit in stream A, followed by a second bit in stream B, and so forth. Multiplexer 46 thereby essentially provides a single serial bitstream from two serial bitstreams and thereby operates as a serializer. Flip-flop 48 can be used to synchronize stream B to the double rate clock before placement upon multiplexer 46. Flip-flop 60 is then used to synchronize the serial bitstream output on the output pin OUT. The output echo clock edges are, therefore, aligned as the rising edge of the clock output is aligned to the falling edge in the inverted clock output.

Avoiding a double rate clock signal not only would minimize power in system 40, but also would reduce the timing constraints between the flip-flop circuits and the multiplexer circuits. In addition, any process or temperature skewing, or any noise caused by the additional clocking rates on the active element, might cause deleterious output clock skewing as well. It would be beneficial to implement another embodiment that avoids the double clock rate internal generation.

Figure 4:
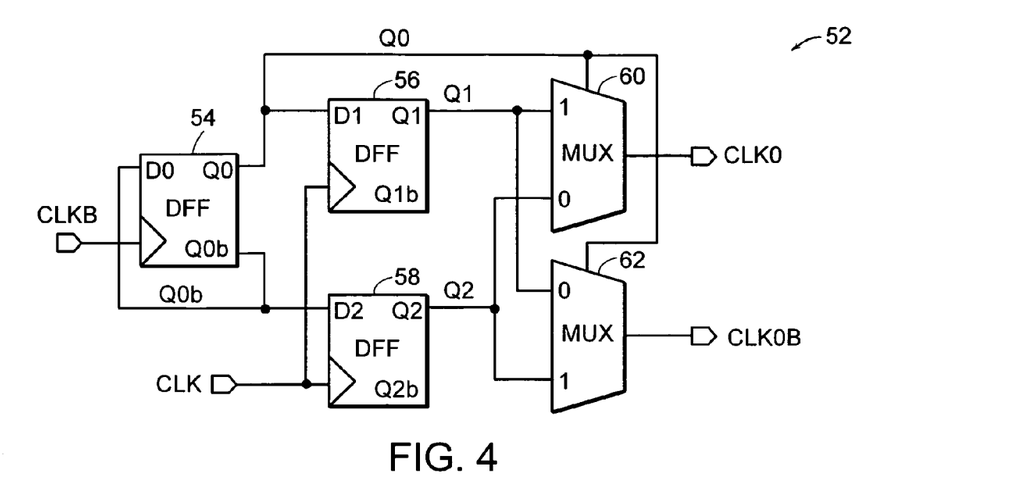
FIG. 4 is a circuit schematic of a system for removing skew from complementary clock signals, according to one preferred embodiment.

Turning now to FIG. 4, a second embodiment is illustrated of a circuit 52 for generating complementary output signals with little if any skew therebetween. Circuit 52 avoids generation of any double clock rate signal and, instead, all internal clocking signals are at the same rate as the complementary pair of input signals, which transitions at the same rate as the complementary pair of output signals. Circuit 52 is preferred over that of circuit 10. Instead of the more complex circuitry of circuit 10, circuit 52 simply includes three flip-flop circuits 54, 56, and 58, and two multiplexer circuits 60 and 62.

The flip-flop circuits are preferably D-type flip-flop circuits, and flip-flop 54 is shown having the inverse output signal connected to the data input signal to operate as a toggle flip-flop. As a toggle flip-flop, flip-flop 54 toggles every clock cycle at the rising edge of inverted input clock signal CLKB. Flip-flop 54 also provides complementary outputs Q0 and Q0b to flip-flop circuits 56 and 58; specifically, to the data inputs of those flip-flop circuits. As a result, the outputs Q1 and Q2 of flip-flop circuits 56 and 58 are driven to opposite states at the same time. This is due to flip-flop circuits 56 and 58 both being clocked by the same clock signal, i.e., the true input clock signal CLK.

Figure 5:
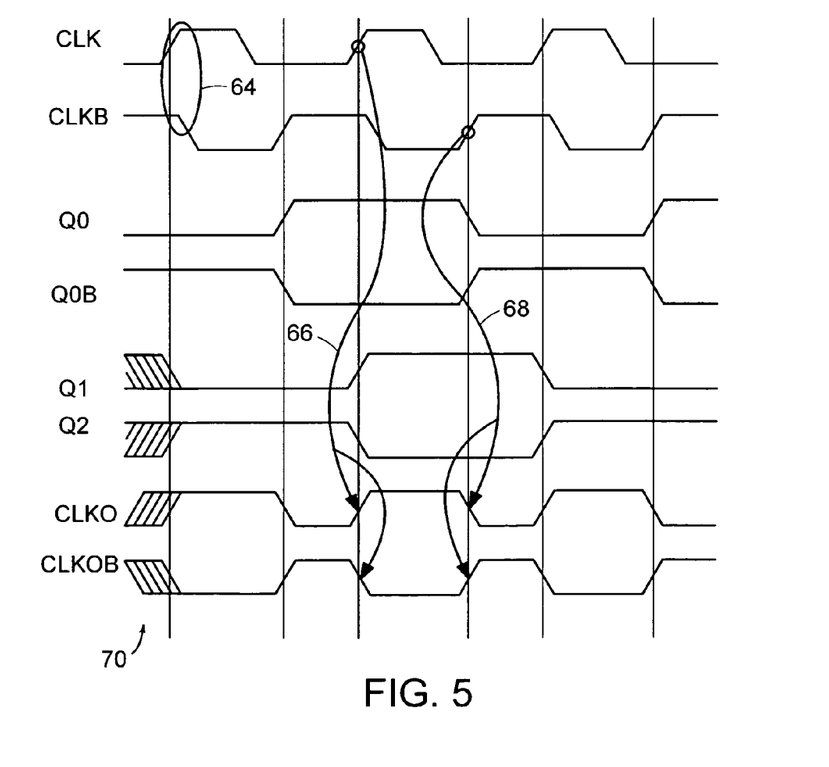
FIG. 5 is a timing diagram of signals input to and produced from various components illustrated in FIG. 4.

Circuit 52 generally operates on the premise that the inverted input clock signal CLKB will be skewed (advanced or delayed) relative to the true input clock signal CLK, as shown by reference numeral 64 of FIG. 5. Since the rising edge of the inverted input clock CLKB will toggle the Q0 and Q0b outputs, knowing that CLKB is delayed relative to CLK will force Q0 and Q0b to be setup with proper setup time prior to the rising edge of CLK. This assures that flip-flop circuits 56 and 58 will not enter into any meta-stable conditions. Moreover, this also assures that, knowing Q0 and Q0b will precede CLK and CLK synchronizing Q1 and Q2, Q1 and Q2 will transition at the same time on the rising edge of CLK, as shown by reference numeral 66.

In addition to CLK rising edge dictating transition 66, rising edge CLKB will also dictate transition 68. This is due to the rising edge of CLKB toggling Q0 and, thus, inverting the selection function of multiplexers 60 and 62. Thus, the outputs of multiplexers 60 and 62 (CLKO, CLKOB) will always invert on the rising edge of CLKB. In summary, the rising edge of CLK sets the true output clock signal CLKO to high and the inverted output clock signal CLKOB to low; the rising edge of the inverted input clock signal CLKB sets the true output clock signal CLKO to low and the inverted output clock signal CLKOB to high.

At the rising edge of input clock CLK, output clock signal CLKO switches to or stays high, regardless of the initial state of the circuit. Thus, if Q0 is initially low, multiplexer 60 passes to the output clock CLKO the present state of Q2, which at the rising edge of input clock CLK samples Q0b and becomes a logic high voltage value. Meanwhile, if Q0 is initially high, multiplexer 60 passes to the clock output signal CLKO the present state of Q1, which at the rising edge of input clock CLK samples Q0 and also becomes a logic high voltage value. Thus, regardless of the state of CLKB and CLK and regardless of Q0, the complementary pair of output signals CLKO and CLKOB will always be of opposite logic values. Circuit 52 thereby enjoys the benefit of not requiring any reset of the circuit prior to receiving the complementary pair of input signals at opposing logic values.

Figure 6:
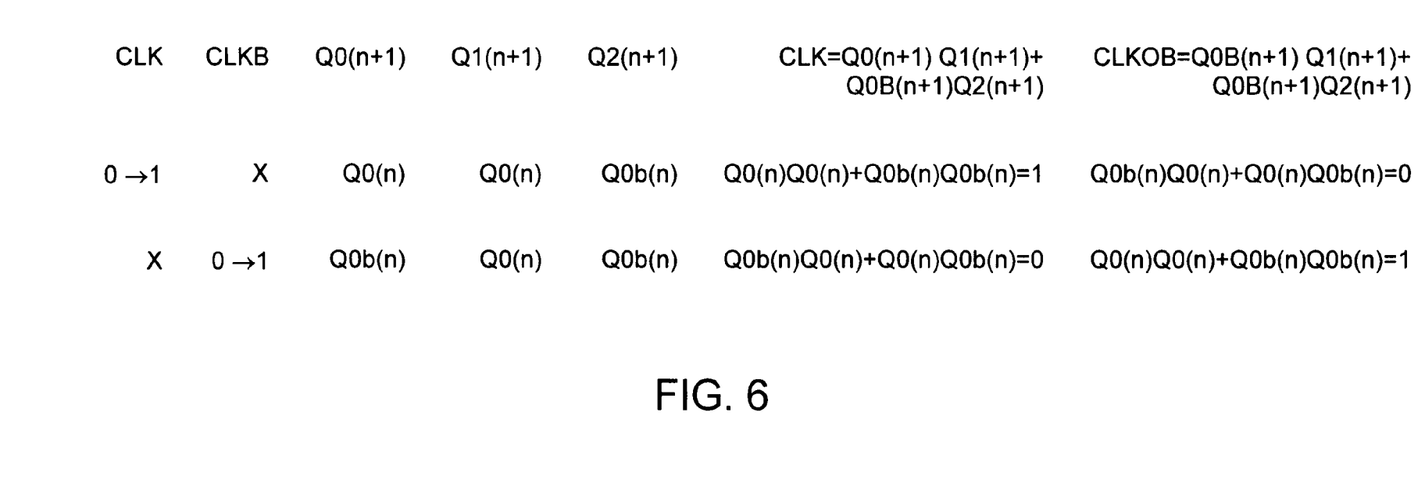
FIG. 6 is a state transition table of outputs produced at various states from changes input to the system of FIG. 4.

At the rising edge of the inverted input clock CLKB, since Q1 and Q2 are in opposite states, Q0 toggles and makes the output clock signal CLKO a logic low voltage value. The inverted output clock signal CLKOB is generated in a similar way as the true output clock signal CLKO, except the inputs to multiplexer 62 are alternated from those of multiplexer 60, so that the rising edge of input clock CLK sets the inverted output clock CLKOB to low and the rising edge of the inverted input clock CLKB sets it to high. The logic function is summarized in the state transition table of FIG. 6. FIG. 5, however, shows the "don't care" conditions of the initial state of circuit 52, yet signals Q1, Q2, CLKO, and CLKOB maintain opposite states as shown by reference numeral 70.

Thus, in addition to the advantage that circuit 52 eliminates the need to generate a double rate clock (i.e., a 2× clock), circuit 52 uses fewer components than circuit 10. Circuit 52 also improves input clock to output clock propagation delay by reducing the overall number of logic stages. As shown in circuit 10, there are multiple delay stages associated with the non-overlapping clock generator, the logic OR stage, and the output flip-flop stage. Each of these elements adds to the propagation delay between the pair of complementary input signals and the pair of complementary output signals.

Circuit 52 can use standard logic components so that the designer does not need to size transistors, or run ad-hoc circuit simulation and optimization for each implementation to ensure its functionality. Thus, no tuning is required in, for example, the delay stages of the square wave generator as used in circuit 10. Moreover, circuit 52 does not require any reset circuitry or complex initialization to maintain the complementary pair of output signals at opposite logic values when the input signals are not transitioning, or possibly are in the same logic value.

Figure 7:
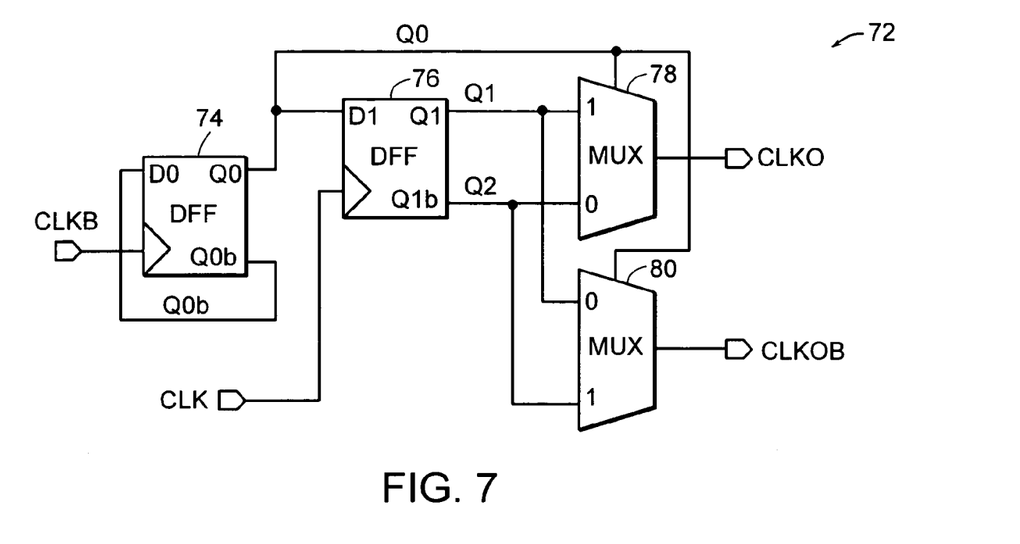
FIG. 7 is a circuit schematic of a system for removing skew from complementary clock signals, according to another preferred embodiment.

According to another alternative embodiment, another clock generation circuit 72 is shown in FIG. 7. Similar to circuit 52 of FIG. 4, circuit 72 also avoids a double rate clock, and has the advantages of circuit 52. However, circuit 72 utilizes only two flip-flop circuits 74 and 76, rather than three as in FIG. 4. The Q2 output can be derived from flip-flop circuit 76 rather than a separate flip-flop as in FIG. 4. Otherwise, signals Q1 and Q2 are still sent to separate multiplexers 78 and 80 to implement the same timing diagram and waveform output set forth in FIG. 5. Thus, the embodiment of FIG. 7 saves one flip-flop and maintains the same logic function.

Figure 8:
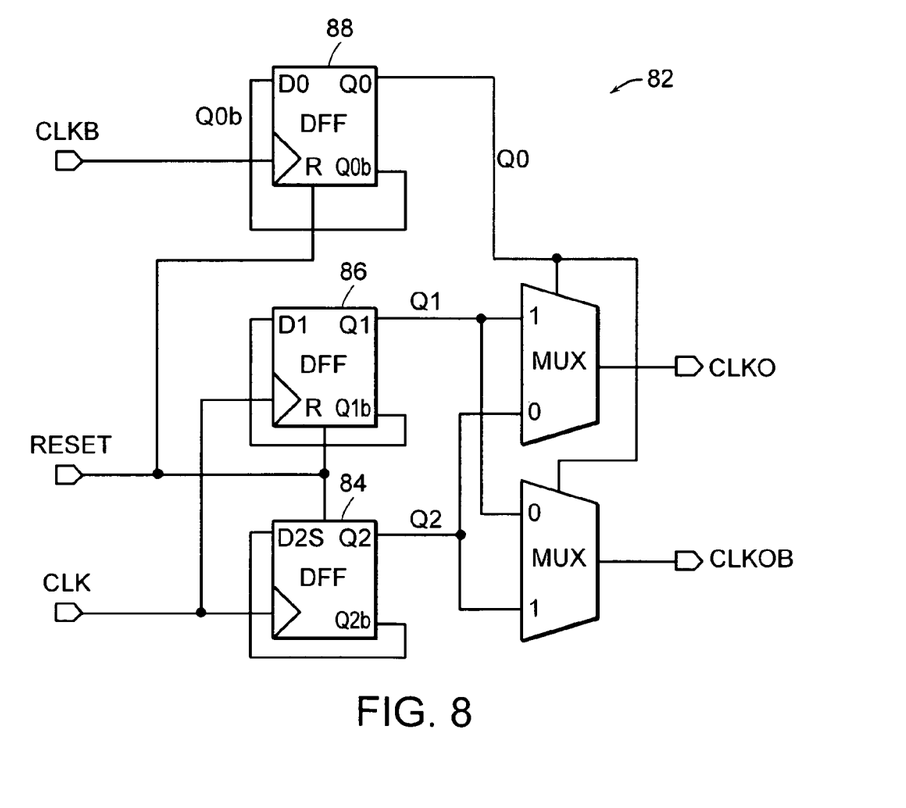
FIG. 8 is a circuit schematic of a system for removing skew from complementary clock signals, according to yet another preferred embodiment.

According to yet another alternative embodiment, another clock generation circuit 82 is shown in FIG. 8. Circuit 82 uses an asynchronous reset signal to reset or preset flip-flops 84, 86, and 88. The outputs Q0 and Q1 are reset to logic low since the reset signal is sent to the "R" inputs of flip-flop circuits 86 and 88. Q2, however, is preset to logic high since the reset signal is sent to the "S" input of flip-flop circuit 84. Each flip-flop with an inverted output connected to a data input can be replaced by a toggle flip-flop if desired since, essentially, each D-type flip-flop 84–88 is connected as a toggle flip-flop. In addition, the output Q1b can replace Q2 to save a flip-flop according to that which is shown in FIG. 7 if desired.

Figure 10:
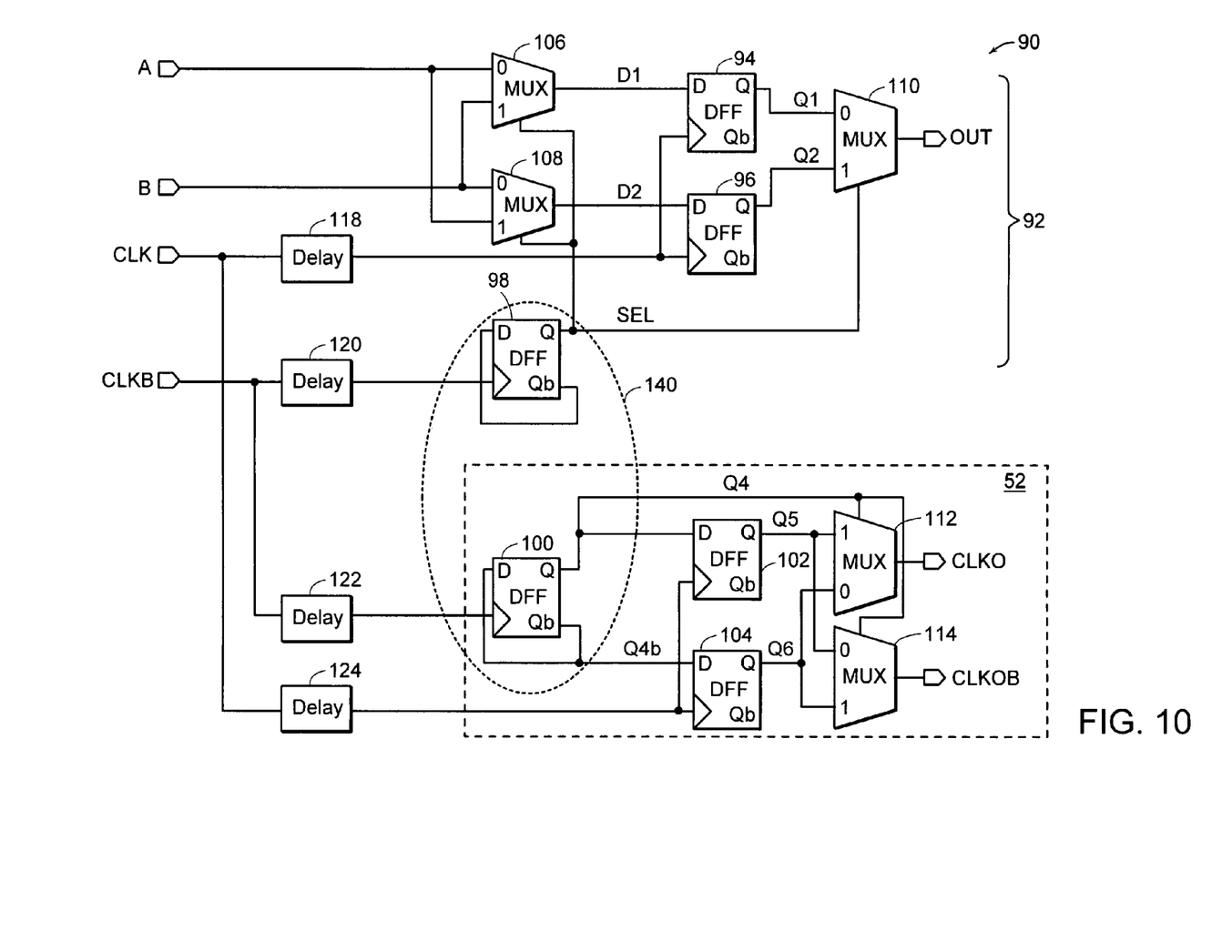
FIG. 10 is a block diagram of a DDR output synchronized with a single rate slew-less clock signal according to a preferred embodiment.
Figure 11:
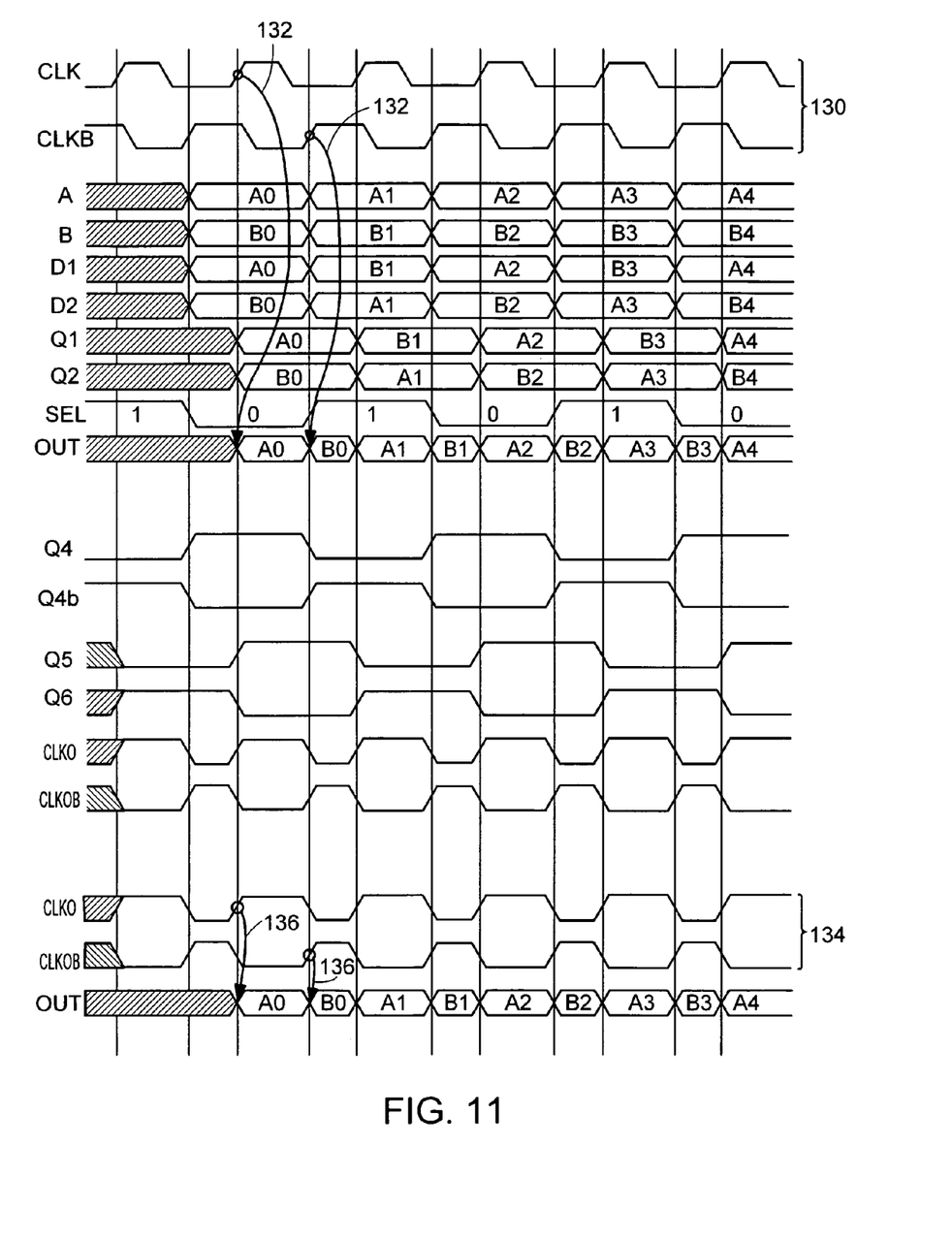
FIG. 11 is a timing diagram of signals input to and produced from various circuit components illustrated in FIG. 10.

FIG. 10 illustrates circuit 52 of FIG. 4 placed within a system 90 for synchronizing the transfer of data. Similar to FIG. 9, system 90 includes an echo clock output path and a data path, collectively referenced as numeral 92. The timing diagram and associated waveform of system 90 is shown in FIG. 11. Referring to FIGS. 10 and 11 in conjunction, system 90 includes flip-flop circuits 94–104 and multiplexer circuits 106–114. Flip-flop circuits 98 and 100 can be combined if desired, both of which toggle every clock cycle at the rising edge of the inverted input clock CLKB. The select signal (SEL) output from flip-flop 98 sets up the data output path by alternating input data from inputs A and B, as well as controlling multiplexer 110. The complementary outputs Q4 and Q4b from flip-flop 100 provide selection control to multiplexers 112 and 114, and inputs to flip-flop circuits 102 and 104 both of which are driven by CLKB. As a result, outputs Q5 and Q6 are always maintained in opposite states, and transition at the same time—i.e., have no skew therebetween.

Data output path 92 comprises a 2-to-1 parallel-in, serial-out (PISO), alternatively known as a serializer. Parallel data from inputs A and B are alternated by multiplexers 106 and 108, before being latched into flip-flop circuits 94 and 96. The alternation is used to ensure correct output data order. The logic function of the echo clock output path is such that the rising edge of input clock CLK sets output clock CLKO to high and the inverted output clock CLKOB to low, and that the rising edge of the inverted input clock CLKB sets the true output clock CLKO to low, and the inverted output clock CLKOB to high. Thus, essentially, circuit 52 operates as described above.

The data output path and the echo clock output path use the same components (i.e., flip-flops and multiplexers) and the same configurations. The purpose of this is to ensure matching propagation delay. If any adjustment is needed, then delay elements 118–124 can be used in either path to adjust the echo clock phase. It is recognized that for sake of brevity, one pair of parallel input paths are shown. However, there can be more than one pair of parallel inputs if desired and, thus, the data path can scale with added multiplexers and flip-flops to accommodate N pairs of parallel incoming bitstreams. By eliminating the double rate clock generation from system 90, data path 92 provides a simple 2-to-1 PISO, with matching echo clock generation.

System 90 uses fewer components than, for example, system 40, and all building blocks are standard logic components. A further advantage is that system 90 improves propagation delay by reducing the overall number of logic stages from the pair of complementary input clocks to the data output and complementary pair of output clocks. Simply put, the propagation delay between the complementary pair of input clocks and latching of the data output is minimized. Another advantage is that the output echo clocks are edge-aligned. More particularly, the duty cycle of the echo clocks (i.e., the complementary pair of output clocks) are only dependent on the rising edge of the complementary pair of input clocks.

As shown in FIG. 11, the rising edge of the complementary input clocks 130 establish transitions of the serial bitstream output from data path 92 (FIG. 10), as shown by reference numeral 132. This matches with the echo clock also having the output of the data transitioning on the rising edges of the complementary pair of output clocks 134, as shown by reference numeral 136. Thus, FIG. 11 illustrates the rising edges of the complementary pair of output clocks being synchronous with transitions of the serial bitstream output from the data path.

Referring again to FIG. 11, flip-flop circuits 98 and 100 can perform the same logic function. Thus, it is possible to merge them into one flip-flop as shown by line 140. However, using two different flip-flop circuits offers more flexibility in the data output path; in addition, the echo clock output path may use different delay elements to adjust the echo clock phase. Using two different flip-flops may also help when implementing multiple instances of data output path with one instance of echo clock output path. It is to be appreciated that the echo clock path is formed from the same complementary pair of input clock signals and, thus, "echoes" the transitions of the data path also formed from the complementary pair of input signals. The echo clock path, along with the data clock path, can then be sent to a succeeding sequential electronic subsystem (not shown). This allows a complementary pair of clock signals to appear contemporaneous with the data signal transition, both of which are used by the subsequent subsystem to perform state operations in accordance with the data signals, and the transitions afforded by the synchronous complementary clock signals.

It should be appreciated that reference throughout this specification to "one embodiment" or "an embodiment" means that a particular feature, structure, or characteristic described in connection with the embodiment is included in at least one embodiment of the present invention. Therefore, it is emphasized and should be appreciated that two or more references to "an embodiment," "one embodiment," or "an alternative embodiment" in various portions of this specification are not necessarily all referring to the same embodiment. Furthermore, the particular features, structures, or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure, aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A system for synchronizing the transfer of data, comprising:
   a multiplexing circuit that interleaves in time at least two serial bitstreams of data;
   a clock generating circuit that receives a complementary pair of input clock signals and produces a complementary pair of output clock signals at substantially the same frequency as the complementary pair of input clock signals, wherein the complementary pair of output clock signals are substantially absent of any time-skew therebetween and transition on only the rising edges of the complementary pair of input clock signals; and
   an output circuit that transfers one bit of the interleaved serial bitstreams as a single serial bitstream during each transition of the complementary pair of input clock signals.

2. The system as recited in claim 1, wherein the multiplexing circuit comprises a pair of multiplexers that produces on separate outputs a first pair of bits in the two serial bitstreams of data followed by an inverse of a second pair of bits in the two serial bitstreams.

3. The system as recited in claim 2, wherein the output circuit comprises a pair of D-type flip flops that include:
   a pair of data inputs coupled to respective said separate outputs of the pair of multiplexers; and
   a pair of data outputs;
   a pair of clock inputs coupled to receive one input clock signal of the complementary pair of input clock signals and forward the first pair of bits followed by an inverse of the second pair of bits onto the pair of data outputs.

4. The system as recited in claim 3, wherein the output circuit further comprises a multiplexer, which is coupled to receive the pair of data outputs and another input clock signal of the complementary pair of input clock signals, for selecting the first pair of bits in succession during one cycle of the complementary pair of input clock signals followed by the inverse of the second pair of bits during an immediately subsequent cycle of the complementary pair of input clock signals.

5. The system as recited in claim 1, wherein the complementary pair of input clock signals comprise a true input clock signal and an inverted input clock signal that transition at the same frequency, and wherein the complementary pair of output clock signals comprise a true output clock signal and an inverted output clock signal that transition at the same frequency.

6. The system as recited in claim 5, wherein the true output clock signal transitions to a logic high voltage value and the inverted output clock signal transitions to a logic low voltage value during a transition of the true input clock signal to a logic high voltage value, and wherein the true output clock signal transitions to a logic low voltage value and the inverted output clock signal transitions to a logic high voltage value during a transition of the inverted input clock signal to a logic high voltage value.

7. The system as recited in claim 1, wherein the clock generating circuit is adapted to produce opposite logic voltage values for the complementary pair of output clock signals prior to receiving the complementary pair of input signals.

8. The system as recited in claim 5, wherein the clock generating circuit is adapted to produce a logic high voltage value upon the true output signal and a logic low voltage value upon the inverted output signal prior to receiving the complementary pair of input signals.

9. A method for generating a skew-less complementary pair of output clock signals, comprising:
   receiving a complementary pair of input clock signals of which one is delayed relative to the other;
   generating a pair of complementary output clock signals that are not delayed relative to one another and which both said pair of complementary output clock signals transition on only the rising edges of the complementary pair of input clock signals;
   using the pair of complementary input clock signals in a data output circuit.

10. The method as recited in claim 9, wherein said generating comprises generating the pair of complementary output clock signals at the same frequency as the pair of complementary input clock signals.

11. The method as recited in claim 9, wherein said using the pair of complementary input clock signals comprises latching a serial bitstream of data at each transition of the pair of input clock signals.

12. The method as recited in claim 9, wherein said using comprises outputting data serially from the data output circuit at twice the rate of said pair of complementary output clock signals and at twice the rate of said pair of complementary input clock signals.

13. The method as recited in claim 9, wherein said generating comprises generating the pair of complementary output clock signals at opposite logic voltage values prior to said receiving the pair of complementary input clock signals.

* * * * *